US009345154B2

(12) United States Patent
Peng

(10) Patent No.: US 9,345,154 B2
(45) Date of Patent: May 17, 2016

(54) AUTOMATIC LOCKING MECHANISM AND ELECTRONIC DEVICE THEREWITH

(71) Applicant: HON HAI PRECISION INDUSTRY CO., LTD., New Taipei (TW)

(72) Inventor: Da-Yi Peng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/585,467

(22) Filed: Dec. 30, 2014

(65) Prior Publication Data

US 2016/0105979 A1    Apr. 14, 2016

(30) Foreign Application Priority Data

Oct. 14, 2014  (CN) .......................... 2014 1 0540887

(51) Int. Cl.
*H05K 5/02* (2006.01)
*F16B 1/00* (2006.01)

(52) U.S. Cl.
CPC ............. *H05K 5/0221* (2013.01); *F16B 1/00* (2013.01); *F16B 2001/0035* (2013.01)

(58) Field of Classification Search
CPC .. H05K 5/0221; F16B 1/00; F16B 2001/0035
USPC .................. 248/206.5, 27.1, 27.3
See application file for complete search history.

(56) References Cited

U.S. PATENT DOCUMENTS

| 4,058,357 | A  | * | 11/1977 | Wallace ............. | B60R 11/0205 211/DIG. 1 |
| 5,996,831 | A  | * | 12/1999 | Teok ..................... | E05B 47/004 220/230 |
| 8,555,468 | B2 | * | 10/2013 | Moerke .............. | B60R 13/0206 24/293 |
| 8,757,461 | B2 | * | 6/2014 | Zanetti ................... | B60R 11/02 224/483 |
| 2007/0138806 | A1 | * | 6/2007 | Ligtenberg ............. | E05C 19/16 292/251.5 |
| 2015/0286117 | A1 | * | 10/2015 | Sung ....................... | A42B 3/04 224/191 |

\* cited by examiner

*Primary Examiner* — Anita M King
(74) *Attorney, Agent, or Firm* — Novak Druce Connolly Bove + Quigg LLP

(57) ABSTRACT

An automatic locking mechanism is configured to lock a housing with a latching groove. The automatic locking mechanism includes a bracket and a magnet. An inclined surface is defined on an edge of the magnet. The bracket defines a groove. A restriction member is positioned in the groove configured to restrict the magnet. The housing is locked to the bracket when the magnet is simultaneously received in both the groove and the latching groove via the attraction of the magnet to the housing. The housing is released when the housing is continuously resisted against the inclined surface of the magnet until the magnet is completely received in the groove. In addition, an electronic device with the automatic locking mechanism is disclosed.

20 Claims, 6 Drawing Sheets

AUTOMATIC LOCKING MECHANISM AND ELECTRONIC DEVICE THEREWITH

FIELD

The subject matter herein generally relates to an electronic device with an automatic locking mechanism.

BACKGROUND

Electronic devices such as car navigation devices need to be fastened to something stable to prevent from dropping. At present, the electronic devices are mostly fastened via a locking assembly such as a screw or a rivet and so on. However, users must use a tool to disassemble and assemble the electronic devices when needing to be repaired.

BRIEF DESCRIPTION OF THE DRAWINGS

Implementations of the present technology will now be described, by way of example only, with reference to the attached figures.

DETAILED DESCRIPTION

Figure 1:
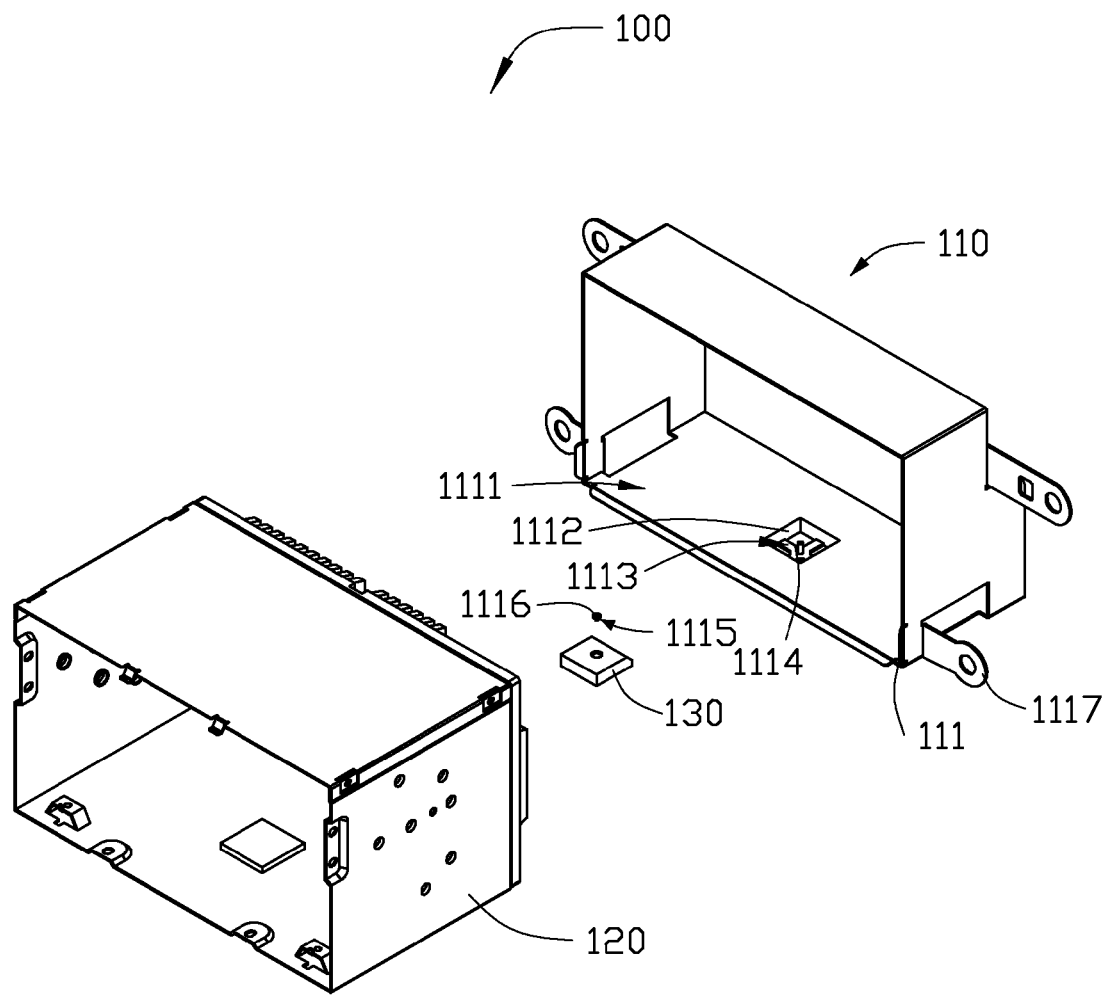
FIG. 1 is an exploded, isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to an electronic device.

FIG. 1 illustrates a first embodiment of an electronic device 100. The electronic device 100 can include an automatic locking mechanism 110 and a housing 120 positioned in the automatic locking mechanism 110. The electronic device 100 can be fastened to another device (not shown) via the automatic locking mechanism 110.

The automatic locking mechanism 110 can include a bracket 111 and a magnet 130 positioned on the bracket 111. The bracket 111 can be rectangular and include a plurality of sidewalls 1111, a groove 1112 defined in one sidewall 1111, and a plurality of fastening portions 1117 positioned on the bracket 111. The groove 1112 can include a bottom portion 1113, a restriction member 1114 positioned on the bottom portion 1113 and a screw 1115 connected to the restriction member 1114. The bottom portion 1113 can be a pierced plane configured to decrease the attraction of the magnet 130 and the bottom portion 1113. The restriction member 1114 can be made of a non-magnetic material. The screw 1115 can include a head portion 1116. The diameter of the head portion 1116 can be larger than the diameter of the restriction member 1114. The bracket 111 can be fastened to the other device (not shown) via the fastening portion 1117. The magnet 130 can be received in the groove 1112 and be slidably circled to the restriction member 1114. The head portion 1116 of the screw 1115 can prevent the magnet 130 from separating from the restriction member 1114. The bracket 111 can be made of the magnetic material.

Figure 2:
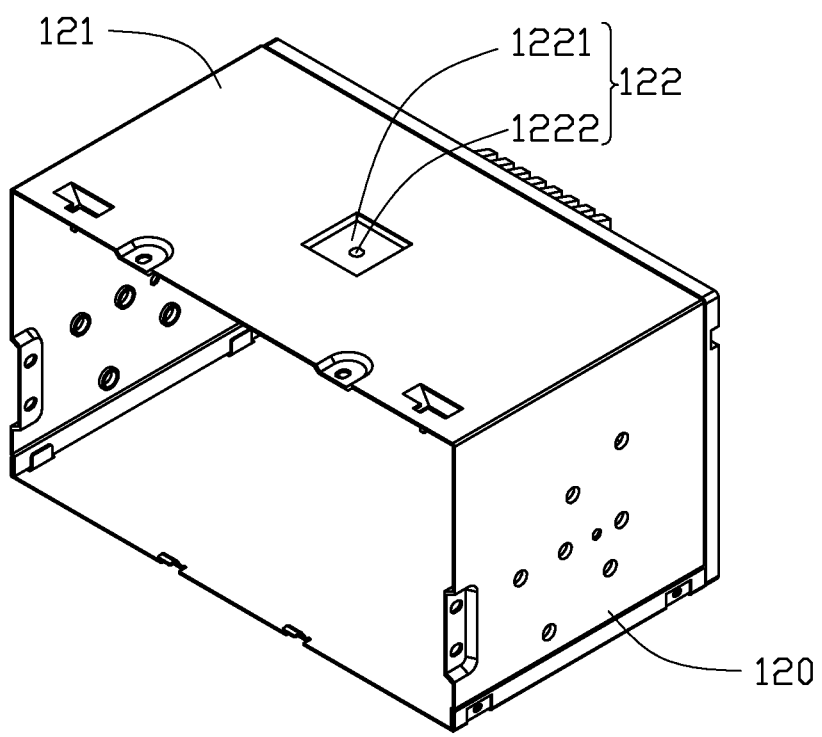
FIG. 2 is an isometric view of a housing of the electronic device of FIG. 1.

FIG. 2 illustrates that the housing 120 can include a main body 121 and a latching groove 122 positioned on the main body 121. The latching groove 122 can be located at the outside of a bottom plate (not labeled) of the main body 121. The latching groove 122 can include a bottom surface 1221 and a projection 1222 positioned on the bottom surface 1221. The shape of the latching groove 122 and the shape of the groove 1112 can be similar. The latching groove 122 can be corresponding to the groove 1112 when the housing 120 is locked to the bracket 111.

Figure 3:
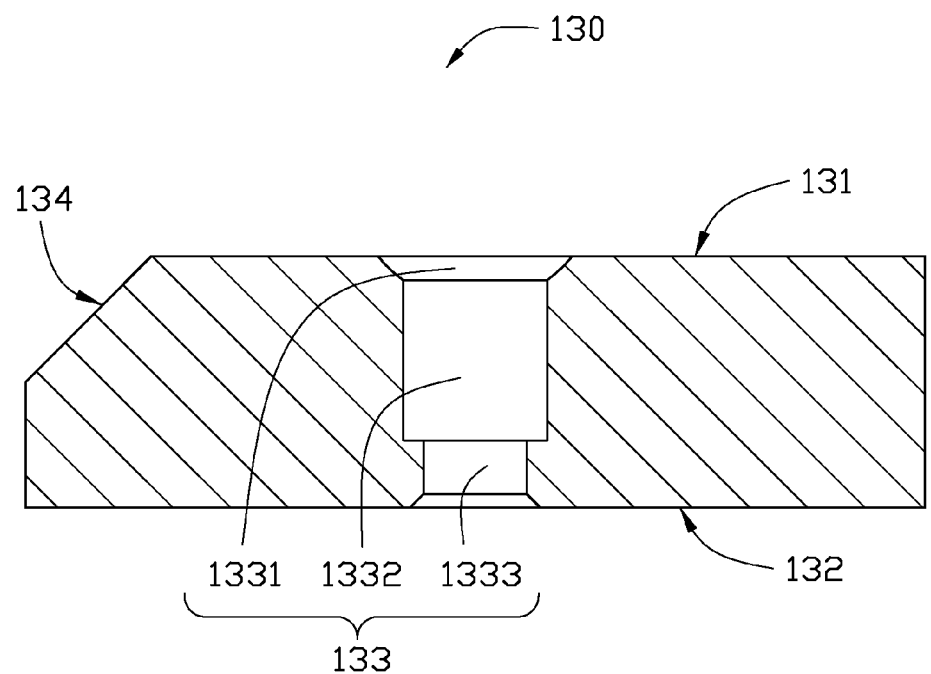
FIG. 3 is a cross-sectional view of a magnet of the electronic device of FIG. 1.

FIG. 1 and FIG. 3 illustrate that the magnet 130 can include an upper surface 131, a lower surface 132 opposite to the upper surface 131, a restriction hole 133 positioned on the upper surface 131, and an inclined surface 134. The shape of the magnet 130 and the shape of the groove 1112 can be similar. The restriction hole 133 can be a stepped hole and pass through the upper surface 131 and the lower surface 132. The restriction hole 133 can include a first through hole portion 1331, a second through hole portion 1332, and a third through hole portion 1333. The first through hole portion 1331 can be adjacent to the upper surface 131 and be coupled to the projection 1222 of the housing 120 (shown in the FIG. 2). The third through hole portion 1333 can be adjacent to the lower surface 132. The second through hole portion 1332 can be located between the first through hole portion 1331 and the third through hole portion 1333. The diameter of the first through hole portion 1331 can be larger than the diameter of the second through hole portion 1332. The diameter of the second through hole portion 1332 can be larger than the diameter of the third through hole portion 1333 and the head portion 1115. The diameter of the third through hole portion 1333 can be larger than the diameter of the restriction member 1114 and be less than the diameter of the head 1116. The inclined surface 134 can be obliquely located on an edge (not labeled) of the upper surface 131. The range of angle between the inclined surface 134 and the upper surface 131 can be in a range from 10 to 45 degrees. The upper surface 131 can be flush with the one sidewall 1111 when the magnet 130 is completely received in the groove 1112.

Figure 4:
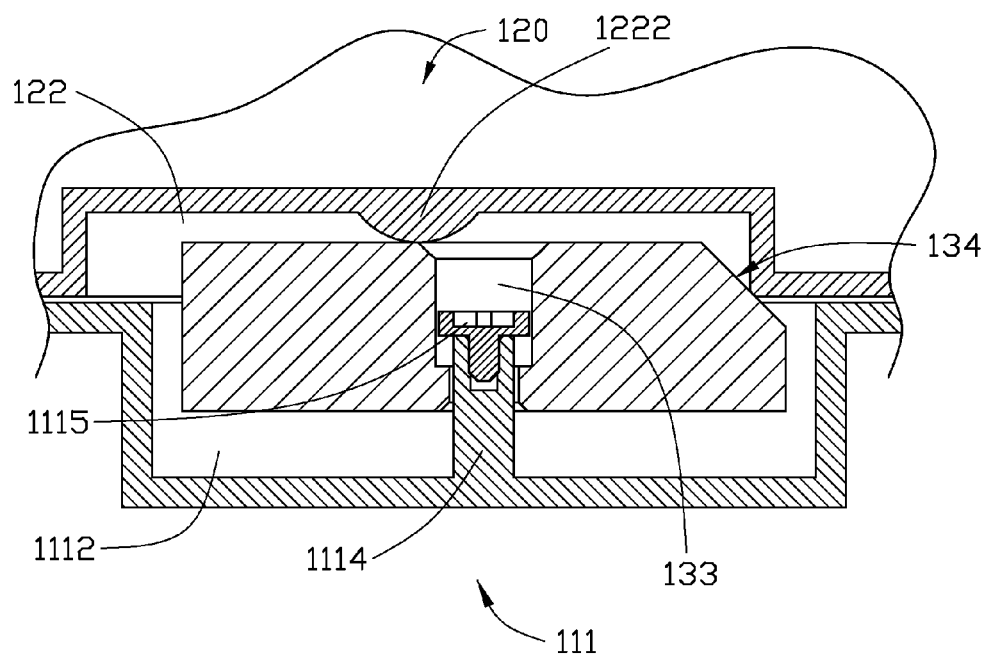
FIG. 4 is a partial, cross-sectional view of the electronic device of FIG. 1 while being assembled and disassembled.
Figure 5:
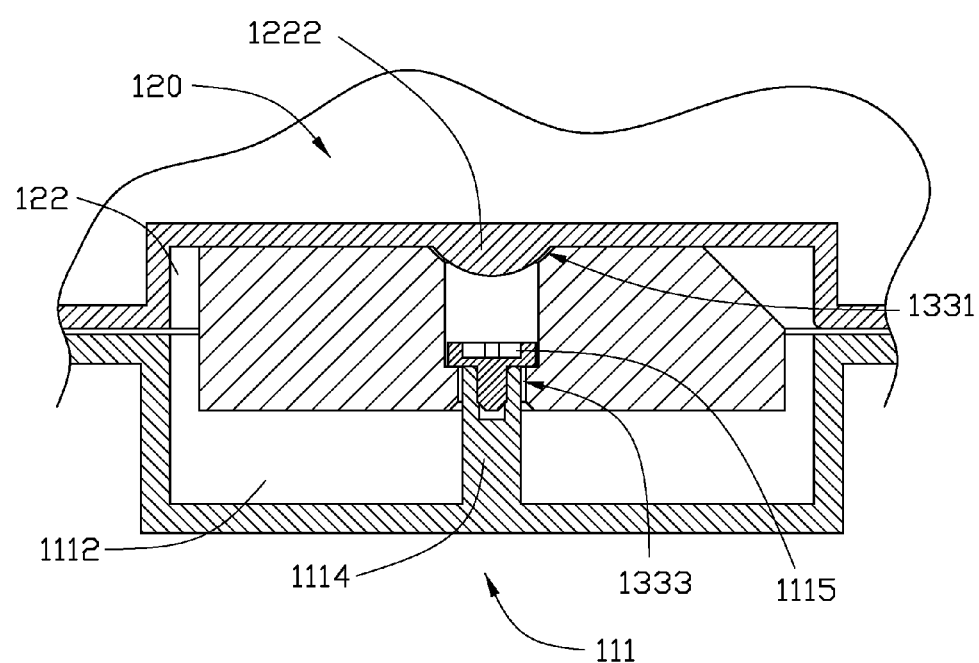
FIG. 5 is a partial, cross-sectional view of the electronic device of FIG. 1 while being locked.

FIG. 4 and FIG. 5 illustrate when in assembly, the magnet 130 can be received in the groove 1112 via the restriction member 1114 passing through the restriction hole 133 of the magnet 130. The screw 1115 can be connected to the restriction member 1114 to prevent the magnet 130 from separating from the restriction member 1114.

FIG. 5 illustrates when in use, the housing 120 can slide into the bracket 111. The magnet 130 can be adhered to the housing 120 due to the fact that the attraction strength of the magnet 130 and the housing 120 is larger than the attraction strength of the magnet 130 and the groove 1112. The magnet 130 can be gradually attracted into the latching groove 122 along the restriction member 1114. Finally the magnet 130 can be received in both the groove 1112 and the latching groove 122, and the projection 1222 of the housing 120 can be coupled to the first through hole portion 1331 of the restriction hole 133. Therefore, the housing 120 can be locked to the bracket 111.

During disassembly of the housing 120 from the bracket 111, when the housing 120 is gradually pulled out of the bracket 111, one edge (not labeled) of the latching groove 122 can be resisted against the inclined surface 134 of the magnet 130. The magnet 130 can be pressed into the groove 1112 by the edge (not labeled) of the latching groove 122. The housing 120 can be disassembled from the bracket 111 when the magnet 130 is completely inserted into the groove 1112.

Figure 6:
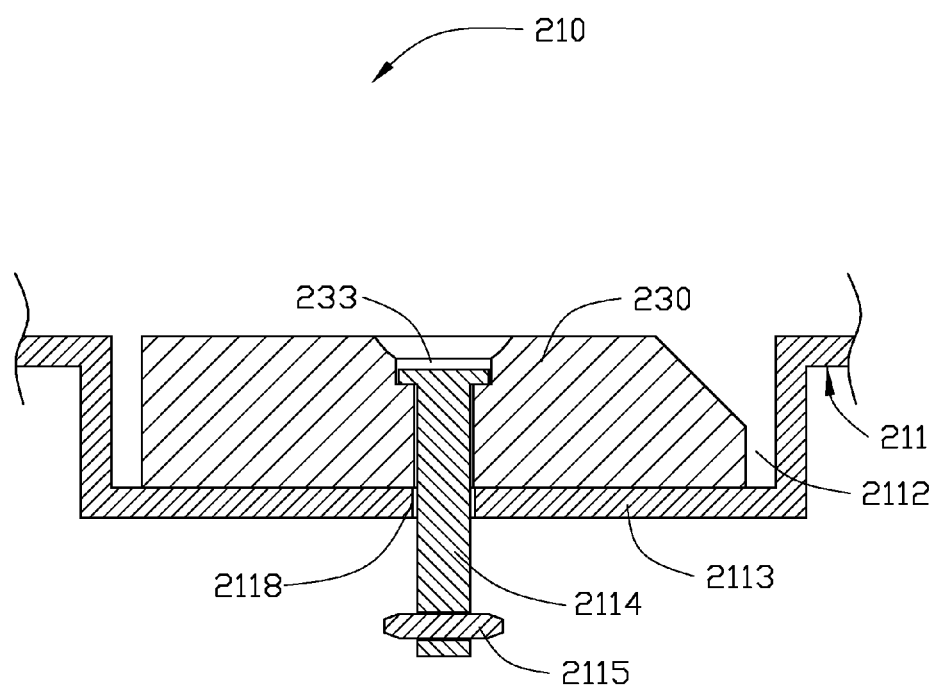
FIG. 6 is partial, cross-sectional view of another embodiment of an electronic device.

FIG. 6 illustrates an automatic locking mechanism 210 in a second embodiment of the disclosure. The automatic locking mechanism 210 is the same as the first embodiment, except that a fastening hole 2118 can be defined on the bottom portion 2113 of the groove 2112 of the bracket 211. To connect the magnet 230 to the bottom portion 2113, the restriction member 2114 is passed through the restriction hole 233 and the fastening hole 2118, the magnet 230 slides along the axis of the fastening hole 2118, one end of the restriction member 2114 that is out of the groove 2112 engages with a nut 2115 to prevent the magnet 230 from dropping from the groove 2112.

In the other embodiments, the restriction 2114 can be directly connected to the magnet 230, and there is no interference from the magnet 230 sliding along the axis of the fastening hole 2118.

As described above, the latching groove 122 can be positioned on the housing 120 and the groove 1112 can be positioned on the bracket 111. The magnet 130 can be received in the both latching groove 122 and the groove 1112 due to the attraction of the magnet 130 and the housing 120 to automatically lock the housing 120. The magnet 130 can be completely pressed into the groove 1112 by the edge (not labeled) of the latching groove 122 when the housing 120 is gradually pulled out of the bracket 111. Therefore the housing 120 can be disassembled from the bracket 111; the housing 120 of the electronic device 100 can be conveniently assembled and disassembled.

The embodiments shown and described above are only examples. Many details are often found in the art such as the other features of an electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An automatic locking mechanism configured to lock a housing onto an electronic device with a latching groove, the automatic locking mechanism comprising:
   a bracket;
   wherein, the bracket comprises a groove positioned on the bracket, a restriction member positioned in the groove, and a magnet received in the groove;
   wherein, the magnet defines an inclined surface located on one edge of the magnet;
   wherein, the magnet can slide along the restriction member, the magnet can be received in both the latching groove and the groove to automatically lock the housing, because the fact that the magnet is magnetically attracted to the housing; and
   wherein, the magnet is arranged such that the magnet is completely pressed into the groove when one edge of the latching groove gradually presses the inclined surface, causing the housing to be unlocked.

2. The automatic locking mechanism as claimed in claim 1, wherein the magnet comprises an upper surface, a lower surface opposite to the upper surface, and a restriction hole positioned on the upper surface.

3. The automatic locking mechanism as claimed in claim 2, wherein the restriction hole is a stepped hole and passes through the upper surface and the lower surface.

4. The automatic locking mechanism as claimed in claim 2, wherein the restriction hole comprises a first through hole portion adjacent to the upper surface, a second through hole portion, and a third through hole portion adjacent to lower surface.

5. The automatic locking mechanism as claimed in claim 2, wherein the groove comprises a bottom portion and a screw, the bottom portion is a pierced plane, the screw comprises a head portion.

6. The automatic locking mechanism as claimed in claim 5, wherein the restriction member is positioned on the bottom portion and the screw is connected to the restriction member.

7. The automatic locking mechanism as claimed in claim 5, wherein the diameter of the first through hole portion is larger than the diameter of the second through hole portion, the diameter of the second through hole portion is larger than the diameter of the third through hole portion and the head portion, the diameter of the third through hole portion is larger than the diameter of the restriction member and is less than the diameter of the head portion.

8. The automatic locking mechanism as claimed in claim 5, wherein the restriction member passes through the restriction hole to restrict the magnet, and the screw is received in the restriction hole to prevent the magnet from separating from the groove.

9. The automatic locking mechanism as claimed in claim 5, wherein a fastening hole is defined in the bottom portion of the groove.

10. The automatic locking mechanism as claimed in claim 9, wherein the restriction member passes through the restriction hole and the fastening hole to connect the magnet to the bottom portion, a nut is engaged with one end of the restriction member out of the groove to prevent the magnet from dropping from the groove.

11. The automatic locking mechanism as claimed in claim 1, wherein the bracket comprises a plurality of sidewalls and a plurality of fastening portions, the groove is defined in one sidewall.

12. An electronic device comprising:
   an automatic locking mechanism comprising a bracket;
   a housing positioned in the bracket;

wherein, the housing defines a latching groove;

wherein, the bracket comprises a groove positioned on the bracket, a restriction member positioned in the groove, and a magnet received in the groove;

wherein, the magnet defines an inclined surface positioned on one edge of the magnet;

wherein, the magnet can slide along the restriction member, the magnet can be received in both the latching groove and the groove to automatically lock the housing, because the fact that the magnet is magnetically attracted to the housing; and wherein, the magnet is arranged such that the magnet is completely pressed into the groove when one edge of the latching groove gradually presses the inclined surface, causing the housing to be unlocked.

13. The electronic device as claimed in claim 12, wherein the magnet comprises an upper surface, a lower surface opposite to the upper surface, and a restriction hole positioned on the upper surface.

14. The electronic device as claimed in claim 13, wherein the restriction hole is a stepped hole and passes through the upper surface and the lower surface.

15. The electronic device as claimed in claim 13, wherein the restriction hole comprises a first through hole portion adjacent to the upper surface, a second through hole portion, and a third through hole portion adjacent to lower surface.

16. The electronic device as claimed in claim 13, wherein the groove comprises a bottom portion and a screw, the bottom portion is a pierced plane, the screw comprises a head portion.

17. The electronic device as claimed in claim 16, wherein the restriction member is positioned on the bottom portion and the screw is connected to the restriction member.

18. The electronic device as claimed in claim 16, wherein the diameter of the first through hole portion is larger than the diameter of the second through hole portion, the diameter of the second through hole portion is larger than the diameter of the third through hole portion and the head portion, the diameter of the third through hole portion is larger than the diameter of the restriction member and is less than the diameter of the head portion.

19. The electronic device as claimed in claim 16, wherein the restriction member passes through the restriction hole to restrict the magnet, and the screw is received in the restriction hole to prevent the magnet from separating from the groove.

20. The electronic device as claimed in claim 12, wherein the latching groove comprises a bottom surface and a projection positioned on the bottom surface, the projection is coupled to the magnet.

\* \* \* \* \*